United States Patent
Kim et al.

(10) Patent No.: US 10,468,617 B2
(45) Date of Patent: Nov. 5, 2019

(54) ORGANIC LIGHT EMITTING DIODE AND ORGANIC LIGHT EMITTING DISPLAY INCLUDING THE SAME

(71) Applicant: LG Display Co., Ltd., Seoul (KR)

(72) Inventors: Sangbeom Kim, Paju-si (KR); Jeongdae Seo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/217,143

(22) Filed: Dec. 12, 2018

(65) Prior Publication Data
US 2019/0198789 A1    Jun. 27, 2019

(30) Foreign Application Priority Data
Dec. 22, 2017    (KR) .................. 10-2017-0178315

(51) Int. Cl.
*H01L 51/50*    (2006.01)
*H01L 51/52*    (2006.01)

(52) U.S. Cl.
CPC ........ *H01L 51/5004* (2013.01); *H01L 51/506* (2013.01); *H01L 51/5203* (2013.01)

(58) Field of Classification Search
CPC ...................................................... H01L 51/50
See application file for complete search history.

(56) References Cited

U.S. PATENT DOCUMENTS

| 8,067,885 B2 | 11/2011 | Kashiwabara |
| 9,406,908 B2 | 8/2016 | Kim et al. |
| 2012/0168735 A1 | 7/2012 | Pflumm et al. |

FOREIGN PATENT DOCUMENTS

| KR | 10-2006-0071399 A | 6/2006 |
| KR | 10-2012-0080606 A | 7/2012 |
| KR | 10-2015-0002249 A | 1/2015 |
| KR | 10-2015-0078333 A | 7/2015 |

OTHER PUBLICATIONS

Notice of Allowance issued in corresponding Korean Patent Application No. Oct. 2017-0178315, dated Jun. 25, 2019.

*Primary Examiner* — Marvin Payen
(74) *Attorney, Agent, or Firm* — Morgan, Lewis & Bockius LLP

(57) ABSTRACT

Disclosed is an organic light emitting diode and an organic light emitting display including the same, where the organic light emitting diode includes: a first electrode; a light emitting stack disposed on the first electrode; and a second electrode disposed on the light emitting stack, where the light emitting stack includes a hole transport layer and a blue light emitting layer such that the hole transport layer and the blue light emitting layer are sequentially stacked on the first electrode, where the blue light emitting layer includes a blue host material and a blue fluorescent dopant material, and the hole transport layer includes a hole transport layer material. The blue fluorescent dopant material has a higher LUMO energy level than the blue host material and the blue fluorescent dopant material has a higher HOMO energy level than the blue host material.

15 Claims, 4 Drawing Sheets

ORGANIC LIGHT EMITTING DIODE AND ORGANIC LIGHT EMITTING DISPLAY INCLUDING THE SAME

CROSS-REFERENCE TO RELATED APPLICATIONS

This application claims the benefit of Korean patent application No. 10-2017-0178315 filed on Dec. 22, 2017, the entire content of which is incorporated herein by reference in its entirety.

BACKGROUND

1. Technical Field

The present invention relates to an organic light emitting diode and an organic light emitting display including the same.

2. Description of the Related Art

Recently, there has been an increased interest in flat display elements occupying a small space, with an increasing size of displays. The technology of organic light emitting displays including organic light emitting diodes (OLEDs) as the flat display elements has been rapidly developing in the art.

An organic light emitting diode emits light through conversion of the energy of excitons created by pairs of electrons and holes generated upon injection of charges into an organic light emitting layer formed between an anode and a cathode. As compared with exiting display techniques, the organic light emitting diode has various advantages, such as low voltage operation, low power consumption, good color reproduction, and various applications through application of a flexible substrate.

Generally, OLEDs can be classified into single OLEDs and tandem OLEDs. The tandem OLED refers to an OLED including two or more light emitting stacks and allows for a more easily achieved improvement in operation voltage and efficiency compared to an existing single OLED.

In a typical white organic light emitting diode (WOLED), the difference in energy levels between the functional layers constituting a blue light emitting layer results in decreased efficiency during injection of electrons or holes at an interface between the functional layers, thereby having a negative influence on the performance and lifespan of the WOLED.

SUMMARY OF THE INVENTION

It is one aspect of the present invention to provide an organic light emitting diode capable of reducing the operation voltage while improving the luminous efficacy and lifespan thereof, and an organic light emitting display including the same.

In accordance with one aspect of the present invention, there is provided an organic light emitting diode including: a first electrode; a light emitting stack disposed on the first electrode; and a second electrode disposed on the light emitting stack.

The light emitting stack may include a hole transport layer and a blue light emitting layer such that the hole transport layer and the blue light emitting layer are sequentially stacked on the first electrode, in which the blue light emitting layer includes a blue host material and a blue fluorescent dopant material, and the hole transport layer includes a hole transport layer material.

The blue fluorescent dopant material has a higher LUMO (Lowest Unoccupied Molecular Orbital) energy level than the blue host material.

The blue fluorescent dopant material has a higher HOMO (Highest Occupied Molecular Orbital) energy level than the blue host material.

The blue fluorescent dopant material has a lower singlet energy than the blue host material.

The hole transport layer material has a higher HOMO energy level than the blue host material.

The hole transport layer material has a higher HOMO energy level than the blue fluorescent dopant material and the difference in HOMO energy levels between the hole transport layer material and the blue fluorescent dopant material is 0.1 eV or less.

The hole transport layer material has a higher LUMO energy level than the blue host material and the difference in LUMO energy levels between the hole transport layer material and the blue host material is 0.5 eV or more.

The hole transport layer material has a higher LUMO energy level than the blue fluorescent dopant material.

The present invention provides an organic light emitting diode that includes a blue light emitting layer while achieving improved operating characteristics and a long lifespan.

BRIEF DESCRIPTION OF THE DRAWINGS

The accompanying drawings, which are included to provide a further understanding of the disclosure, illustrate embodiments of the disclosure and together with the description serve to explain various principles.

DETAILED DESCRIPTION

Figure 1:
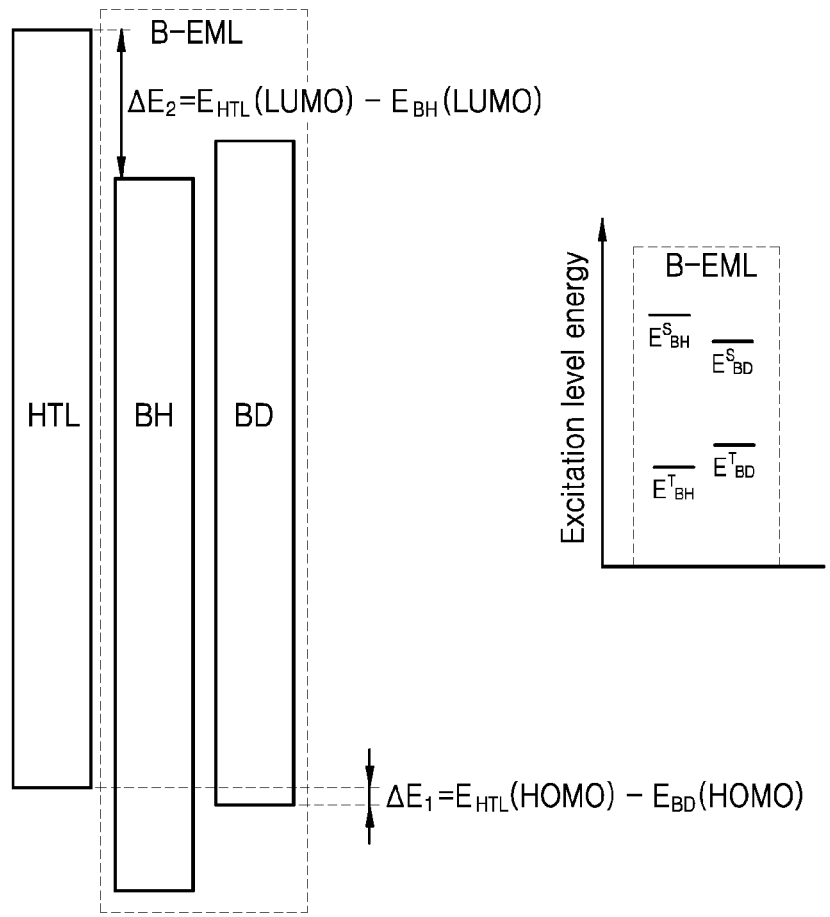
FIG. 1 is an energy diagram depicting energy levels of a hole transport layer (HTL) and a blue light emitting layer (B-EML) of an organic light emitting diode according to the present invention.

Hereinafter, embodiments of the present invention will be described in detail with reference to the accompanying drawings such that the technical idea of the present invention can be more easily realized by those skilled in the art. It should be understood that the present invention is not limited to the following embodiments and may exist as different embodiments.

In the drawings, the portions irrelevant to the description will be omitted for clarity and like components will be denoted by like reference numerals throughout the specification. In addition, description of known functions and constructions which may unnecessarily obscure the subject matter of the present invention will be omitted.

It will be understood that, when an element such as a layer, film, region or substrate is referred to as being placed "above"/"below" or "on"/"under" another element, it can be directly placed on the other element, or intervening layer(s) may also be present. It will be understood that, although the terms "first", "second", "A", "B", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element or component discussed below could also be described as a "second" element or component, or vice versa, without departing from the scope of the present invention. When an element or layer is referred to as being "on," "connected to," or "coupled to" another element or layer, it may be directly on, connected to, or coupled to the other element or layer or intervening elements or layers may be present. However, when an element or layer is referred to as being "directly on," "directly connected to," or "directly coupled to" another element or layer, there are no intervening elements or layers present.

In accordance with one aspect of the present invention, there is provided an organic light emitting diode including: a first electrode; a light emitting stack disposed on the first electrode; and a second electrode disposed on the light emitting stack.

The light emitting stack includes a hole transport layer and a blue light emitting layer such that the hole transport layer and the blue light emitting layer are sequentially stacked on the first electrode.

The blue light emitting layer includes a blue host material and a blue fluorescent dopant material.

The hole transport layer includes a hole transport layer material.

The light emitting stack satisfies the following energy level conditions (A) to (G):

(A) The blue fluorescent dopant material has a higher LUMO (Lowest Unoccupied Molecular Orbital) energy level than the blue host material;

(B) the blue fluorescent dopant material has a higher HOMO (Highest Occupied Molecular Orbital) energy level than the blue host material;

(C) the blue fluorescent dopant material has a lower singlet energy than the blue host material;

(D) the hole transport layer material has a higher HOMO energy level than the blue host material;

(E) the hole transport layer material has a higher HOMO energy level than the blue fluorescent dopant material and the difference in HOMO energy levels between the hole transport layer material and the blue fluorescent dopant material is 0.1 eV or less;

(F) the hole transport layer material has a higher LUMO energy level than the blue host material and the difference in LUMO energy levels between the hole transport layer material and the blue host material is 0.5 eV or more; and (G) the hole transport layer material has a higher LUMO energy level than the blue fluorescent dopant material.

The organic light emitting diode including the light emitting stack that satisfies the energy level conditions of the blue fluorescent dopant material and the blue host material facilitates injection and recombination of electrons and holes in the blue light emitting layer such that excitons can be generated only within the light emitting layer, thereby improving the operating characteristics and the lifespan thereof.

Further, in the organic light emitting diode including the hole transport layer satisfying the HOMO energy level conditions of the hole transport layer material, holes are injected into the light emitting layer through the hole transport layer at the anode and the blue fluorescent dopant material forming the light emitting layer exhibits strong hole characteristics. In this case, a small difference in the HOMO energy levels may be set between the blue fluorescent dopant material exhibiting the hole characteristics and the hole transport layer, thereby improving hole injection from the hole transport layer into the light emitting layer. With this structure, the organic light emitting diode can achieve improved operating characteristics and a long lifespan.

In the organic light emitting diode that includes the light emitting stack including the blue light emitting layer and the hole transport layer satisfying the LUMO energy level conditions of the blue host material, the blue fluorescent dopant material and the hole transport layer material, distribution of the electrons is restricted in the blue light emitting layer, thereby enabling efficient control of the generation of excitons. In addition, the organic light emitting diode prevents the excitons generated in the blue light emitting layer from migrating into the hole transport layer, thereby preventing an addition reaction and energy loss due to the excitons. As a result, the organic light emitting diode can prevent any variation in the charge migration characteristics due to impurities generated by an addition reaction, which can be generated by the excitons having migrated to the hole transport layer, and can maintain the operating characteristics thereof. Further, in the organic light emitting diode, a site where the exciton energy is used is restricted in the blue light emitting layer, thereby improving luminous efficacy. With this structure, the organic light emitting diode can achieve improved operating characteristics and a long lifespan.

FIG. 1 is an energy diagram depicting energy levels of a hole transport layer (HTL) and a blue light emitting layer (B-EML) of an organic light emitting diode according to the present invention. In FIG. 1, the blue light emitting layer (B-EML) is composed of a blue fluorescent dopant material (BD) and a blue host material (BH).

Referring to FIG. 1, the energy level of each layer in the organic light emitting diode satisfies Conditions (A) to (G). Specifically, as shown in FIG. 1, the blue fluorescent dopant material (BD) has a higher LUMO energy level than the blue host material (BH), satisfying Condition (A). In addition, the blue fluorescent dopant material (BD) has a higher HOMO energy level than the blue host material (BH), satisfying Condition (B). Also, the blue fluorescent dopant material (BD) has a lower singlet energy than the blue host material (BH), satisfying Condition (C). Further, the hole transport layer (HTL) material has a higher HOMO energy level than the blue host material (BH), satisfying Condition (D). In addition, the $\Delta E_1$ reflects Condition (E) wherein the hole transport layer (HTL) material has a higher HOMO energy level than the blue fluorescent dopant material (BD). The difference in the HOMO energy levels between the hole transport layer material and the blue fluorescent dopant material is 0.1 eV or less. That is, $\Delta E_1 \leq 0.1$ eV. Also, the $\Delta E_2$ reflects Condition (F) wherein the hole transport layer (HTL) material has a higher LUMO energy level than the blue host material (BH). The difference in LUMO energy levels between the hole transport layer (HTL) material and the blue host material (BH) is 0.5 eV or more. That is, $\Delta E_2 \geq 0.5$ eV. In addition, the hole transport layer (HTL) material has a higher LUMO energy level than the blue fluorescent dopant material (BD), satisfying Condition (G).

Figure 2:
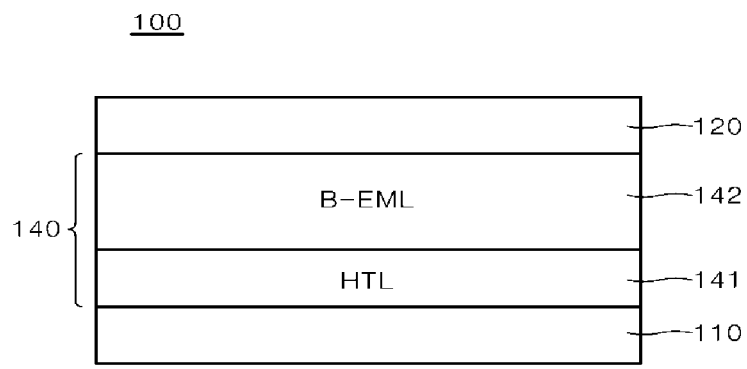
FIG. 2 is a sectional view of an organic light emitting diode according to one exemplary embodiment of the present invention.

FIG. 2 is a sectional view of an organic light emitting diode 100 according to one exemplary embodiment of the present invention, which includes a first electrode 110, a light emitting stack 140 including a hole transport layer (HTL) 141 and a blue light emitting layer (B-EML) 142 adjoining the hole transport layer (HTL) 141, and a second electrode 120.

The first electrode 110 is an anode through which holes are injected into the organic light emitting diode, and may be formed of a conductive material having a high work function. For example, the first electrode 110 may be formed of at least one of indium tin oxide (ITO), indium zinc oxide (IZO), and zinc oxide (ZnO).

The second electrode 120 is a cathode through which electrons are injected into the organic light emitting diode, and may be formed of a conductive material having a low work function. For example, the second electrode 120 may be formed of at least one of aluminum (Al), magnesium (Mg), and aluminum-magnesium alloys (AlMg).

The light emitting stack 140 includes the hole transport layer (HTL) 141 and the blue light emitting layer (BML) 142 interposed between the first electrode 110 and the second electrode 120.

The hole transport layer (HTL) 141 is interposed between the first electrode 110 and the blue light emitting layer (B-EML) 142.

The hole transport layer (HTL) 141 may be formed of any one selected from the group consisting of N,N'-diphenyl-N, N'-bis(3-methylphenyl)-1,1'-biphenyl-4,4'-diamine (TPD), NPD, MTDATA, 1,3-bis(N-carbazolyl)benzene (mCP), CuPC, TCTA, tris(trifluorovinylether)-tris(4-carbazolyl-9-yl-phenyl)amine (TFV-TCTA), tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, tri-p-tolylamine, N-[1,1'-biphenyl]-4-yl-9,9-dimethyl-N-[4-(9-phenyl-9H-carbazol-3-yl)phenyl]-amine, 4,4'-bis(N-carbazolyl)-1,1'-biphenyl (CBP), 1,1-bis(4-(N,N'-di(p-tolyl)amino)phenyl)cyclohexane (TAPC), and combinations thereof.

In one embodiment, the hole transport layer (HTL) material may be a tertiary amine-containing compound.

The blue light emitting layer (B-EML) 142 includes a blue host material (BH) and a blue fluorescent dopant material (BD).

In one embodiment, the blue host material (BH) may include an anthracene-containing compound. Specifically, the blue host material (BH) may include one compound selected from the group consisting of 9,10-di-(2-naphthyl)anthracene (ADN), 2-tert-butyl-9,10-di(2-naphthyl)anthracene, 2-methyl-9,10-di(2-naphthyl)anthracene (MADN), and combinations thereof.

In one embodiment, the blue fluorescent dopant material (BD) may include a pyrene amine-containing compound. Specifically, the blue fluorescent dopant material (BD) may include a compound selected from the group consisting of 1,6-bis(diphenylamine)pyrene, tetrakis(t-butyl)perylene (TBPe), and combinations thereof, without being limited thereto.

The blue light emitting layer (B-EML) 142 may include 1% by weight (wt %) to 5 wt % of the blue fluorescent dopant material (BD). Within this content of the blue fluorescent dopant material (BD), the blue light emitting layer (B-EML) 142 can effectively satisfy the energy level conditions described above. If the content of the blue fluorescent dopant material (BD) exceeds this range, concentration extinction can occur between dopant materials, thereby causing decreased efficiency at high brightness. If the content of the blue fluorescent dopant material (BD) is less than this range, energy transfer from a host to a dopant becomes difficult, thereby making it difficult to obtain a desired level of luminosity while reducing the lifespan of the organic light emitting diode due to side reactions in the light emitting layer.

The light emitting stack 140 may optionally further include a hole injection layer (HIL), an electron transport layer (ETL), and an electron injection layer (EIL), as needed.

The hole injection layer (HIL) may be interposed between the first electrode 120 and the hole transport layer (HTL) 142. The hole injection layer (HIL) improves the interface characteristics between the first electrode 120 formed of an inorganic material and the hole transport layer (HTL) 142 formed of an inorganic material.

For example, the hole injection layer (HIL) may include one material selected from the group consisting of 4,4',4"-tris(3-methylphenylphenylamino)triphenylamine (MTDATA), copper phthalocyanine (CuPc), tris(4-carbazolyl-9-yl-phenyl)amine (TCTA), N,N'-diphenyl-N,N'-bis(1-naphthyl)-1,1'-biphenyl-4,4"-diamine (NPB, NPD), 1,4,5,8,9,11-hexaazatriphenylenehexacarbonitrile (HATCN), 1,3,5-tris [4-(diphenylamino)phenyl]benzene (TDAPB), poly(3,4-ethylenedioxythiophene)polystyrene sulfonate (PEDOT/PSS), 2,3,5,6-tetrafluoro-7,7,8, 8-tetracyanoquinodimethane (F4-TCNQ), N-(biphenyl-4-yl)-9,9-dimethyl-N-(4-(9-phenyl-9H-carbazol-3-yl)phenyl)-9H-fluoren-2-amine, and combinations thereof.

The electron transport layer (HTL) may be interposed between the blue light emitting layer (B-EML) 142 and the second electrode 120 and serves to secure the efficient transport of electrons.

For example, the electron transport layer (HTL) may include derivatives, such as oxadiazole, triazole, phenanthroline, benzoxazole, benzothiazole, benzimidazole, triazine, and the like.

Specifically, the electron transport layer (HTL) may be formed of an electron transport material selected from the group consisting of Alq3, 2-biphenyl-4-yl-5-(4-tertbutylphenyl)-1,3,4-oxadiazole (PBD), spiro-PBD, lithium quinolate (Liq), 2-[4-(9,10-Di-2-naphthalenyl-2-anthracenyl)phenyl]-1-phenyl-1H-benzimidazol, 3-(biphenyl-4-yl)-5-(4-tertbutylphenyl)-4-phenyl-4H-1,2,4-triazole (TAZ), 4,7-diphenyl-1,10-phenanthroline (Bphen), tris(phenylquinoxaline) (TPQ), 1,3,5-tri [(3-pyridyl)-phen-3-yl]benzene (TmPyPB), 1,3,5-tris(N-phenylbenzimiazole-2-yl)benzene (TPBI), and combinations thereof.

Optionally, the electron transport layer (HTL) may be formed by doping with an alkali metal or alkaline earth metal compound. Examples of metal components that can be used as a dopant for the electron transport layer (HTL) may include alkali metals, such as lithium (Li), sodium (Na), potassium (K) and cesium (Cs), and alkaline earth metals, such as magnesium (Mg), strontium (Sr), barium (Ba), and radium (Ra), without being limited thereto. The alkali metal or alkaline earth metal compound may be present in an amount of about 1 wt % to 20 wt %, without being limited thereto.

The electron injection layer (EIL) may be interposed between the electron transport layer (ETL) and the second electrode 120 and serves to secure efficient injection of electrons. For example, the electron injection layer (EIL) may include at least one selected from the group consisting of alkali and alkaline earth halides, such as LiF, NaF, KF, RbF, CsF, FrF, BeF$_2$, MgF$_2$, CaF$_2$, SrF$_2$, BaF$_2$ and RaF$_2$; and organic materials, such as Liq (lithium quinolate), lithium benzoate, sodium stearate, Alq$_3$, BAlq, PBD, spiro-PBD, and TAZ, and combinations thereof.

Figure 3:
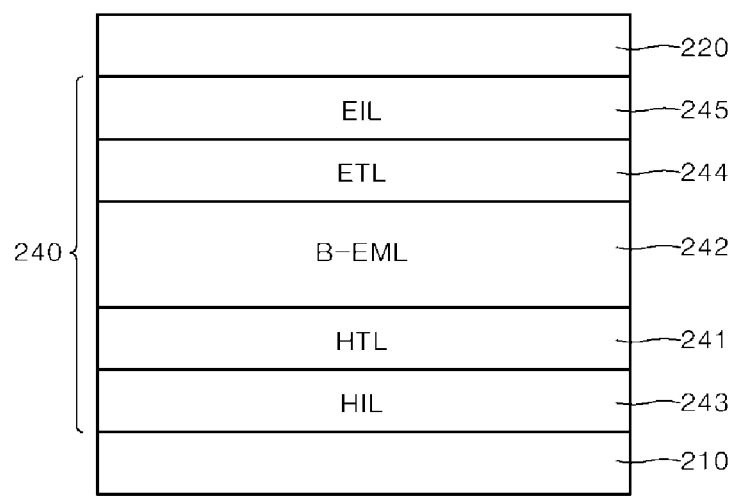
FIG. 3 is a sectional view of an organic light emitting diode according to another exemplary embodiment of the present invention.

FIG. 3 is a sectional view of an organic light emitting diode 200 according to another exemplary embodiment of the present invention, which includes a first electrode 210, a light emitting stack 240 and a second electrode 220. Referring to FIG. 3, the light emitting stack 240 includes a hole injection layer (HIL) 243, a hole transport layer (HTL) 241, a blue light emitting layer (B-EML) 242, an electron transport layer (ETL) 244, and an electron injection layer (EIL) 245. Details of the layers stacked in the organic light emitting diode 200 according to this embodiment are the same as those described for the above embodiment and so a detailed description thereof will be omitted.

The organic light emitting diode may have a tandem structure including at least two light emitting stacks.

In one embodiment, in each of the light emitting stacks 142, 242 is a first light emitting stack, and the organic light emitting diode may further include at least one additional light emitting stack including a second light emitting stack interposed between the first electrode and the second electrode.

Figure 4:
FIG. 4 is a sectional view of an organic light emitting diode according to a further exemplary embodiment of the present invention.

FIG. 4 is a sectional view of an organic light emitting diode 300 according to a further exemplary embodiment of the present invention, which includes a first electrode 310, a first light emitting stack (ST1) 340, a charge generation layer (CGL) 360, a second light emitting stack (ST2) 350, and a second electrode 320. Referring to FIG. 4, the first light emitting stack (ST1) 340 includes a first hole transport layer (HTL) 341 and a first blue light emitting layer 342, and the second light emitting stack (ST2) 350 includes a second hole transport layer (HTL) 351 and a second blue light emitting layer 352. In addition, each of the first light emitting stack (ST1) 340 and the second light emitting stack (ST2) 350 may further include an organic layer, such as a hole injection layer, a hole transport layer, an electron transport layer, and an electron injection layer, as needed. Details of the layers stacked in the organic light emitting diode 300 according to this embodiment are the same as those described for the above embodiment and so a detailed description thereof will be omitted.

In the organic light emitting diode 300, the charge generation layer (CGL) 360 is interposed between the first light emitting stack (ST1) 340 and the second light emitting stack (ST2) 350 to improve current efficiency in each of the light emitting layers while securing efficient distribution of charges. That is, the charge generation layer 360 is interposed between first light emitting stack (ST1) 340 and the second light emitting stack (ST2) 350. The first light emitting stack (ST1) 340 is connected to the second light emitting stack (ST2) 350 by the charge generation layer 360. The charge generation layer 360 may be a PN junction charge generation layer in which an N-type charge generation layer 362 adjoins a P-type charge generation layer 364.

The N-type charge generation layer 362 is disposed to face the first light emitting stack (ST1) 340 and the P-type charge generation layer 364 is disposed to face the second light emitting stack (ST2) 350. The charge generation layer 360 generates charges or divides the charges into holes and electrons to supply the holes and electrons to the first and second light emitting stacks 340, 350.

That is, the N-type charge generation layer 362 supplies electrons to the first light emitting stack (ST1) 340 adjacent to the first electrode 310. The P-type charge generation layer 364 supplies holes to the second light emitting stack (ST2) 350 and the second hole transport layer 351 supplies holes to the second light emitting stack (ST2) 350 adjacent to the second electrode 320.

The N-type charge generation layer 362 may be formed to constitute a host-dopant system and thus include an N-type dopant material and an N-type host material. The N-type dopant material may include Group I and II metals from the periodic table, organic materials capable of supplying electrons, or a mixture thereof. For example, the N-type dopant material may include one of an alkali metal and an alkaline earth metal. That is, the N-type charge generation layer 362 may be an organic layer formed by doping with an alkali metal, such as lithium (Li), sodium (Na), potassium (K), and cesium (Cs), or an alkaline earth metal, such as magnesium (Mg), strontium (Sr), barium (Ba), and radium (Ra), without being limited thereto. The N-type host material may include at least one material capable of supplying electrons and selected from the group consisting of, for example, tris(8-hydroxyquinolino)aluminum (Alq3), 8-hydroxyquinolino-lato-lithium (Liq), 2-(4-biphenylyl)-5-(4-tert-butylphenyl)-1,3,4-oxadiazole (PBD), 3-(4-biphenyl)4-phenyl-5-tert-butylphenyl-1,2,4-triazole (TAZ), Spiro-PBD, bis(2-methyl-8-quinolinolate)-4-(phenylphenolato)aluminum (BAlq), SAlq, 2,2',2-(1,3,5-benzinetriyl)-tris(1-phenyl-1-H-benzimidazole (TPBi), oxadiazole, triazole, phenanthroline, benzoxazole, and benzthiazole, without being limited thereto.

Alternatively, the N-type charge generation layer 362 may not constitute the host-dopant system. That is, the N-type charge generation layer 362 may be free from the N-type dopant material.

The P-type charge generation layer 364 may include a P-type dopant material and a P-type host material. The P-type charge generation layer 364 is disposed on the N-type charge generation layer 362 to form a PN junction together with the N-type charge generation layer 362. The P-type dopant material may include a metal oxide, an organic material, such as tetrafluoro-tetracyanoquinodimethane (F4-TCNQ), hexaazatriphenylenehexacarbonitrile (HAT-CN), hexaazatriphenylene, and the like, or a metallic material, such as $V_2O_5$, MoOx, and $WO_3$, without being limited thereto. The P-type host material may include at least one material capable of transferring holes selected from the group consisting of, for example, N,N-dinaphthyl-N,N'-diphenyl benzidine (N,N'-bis(naphthalene-1-yl)-N,N'-bis (phenyl)-2,2'-dimethyl benzidine, NPD), N,N'-bis-(3-methylphenyl)-N,N'-bis-(phenyl)-benzidine (TPD), and 4,4',4-tris(N-3-methylphenyl-N-phenyl-amino)-triphenylamine (MTDATA), without being limited thereto.

The additional light emitting stack may emit red (R), green (G) or yellow (Y) light.

In one embodiment, the first light emitting stack (ST1) 340 may emit blue light and the second light emitting stack (ST2) 350 may emit green (G), yellow green (YG), yellow (Y) or orange light, which has a longer wavelength than the blue light.

In one embodiment, the organic light emitting diode may be a white organic light emitting diode which has luminous characteristics of red (R), green (G), and blue (B) colors, which are the three primary colors of light. For example, in the white organic light emitting diode, the first light emitting stack (ST1) 340 emits blue light and the second light emitting stack (ST2) 350 includes one host material and a yellow dopant to emit yellow (Y) light such that the white organic light emitting diode emits blue and yellow light, thereby realizing white light. In operation of the white organic light emitting diode, white light can be realized through the mixture of light emitted from the first light emitting stack (ST1) 340 and light emitted from the second light emitting stack (ST2) 350.

The organic light emitting diode may be applied to an organic light emitting display and a lighting apparatus.

In accordance with another aspect of the present invention, there is provided an organic light emitting display, which includes a substrate, an organic light emitting diode disposed above the substrate, and a driving device interposed between the substrate and the organic light emitting diode and connected to the first electrode.

Figure 5:
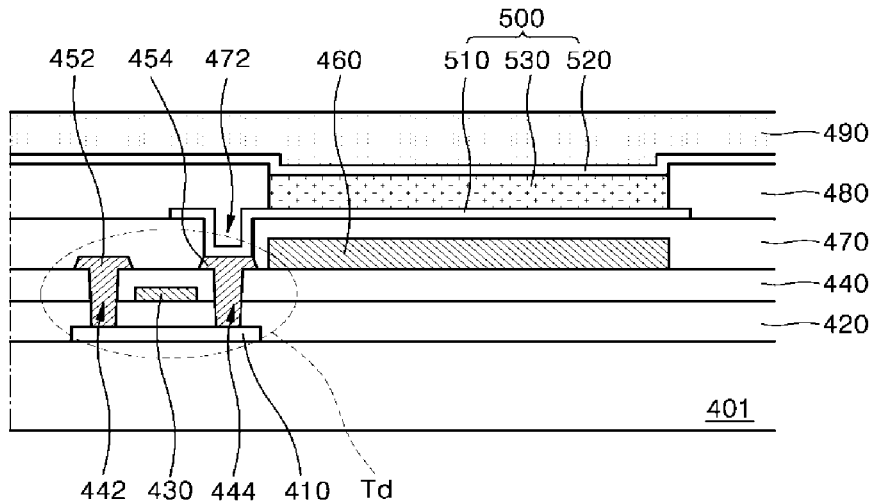
FIG. 5 is a sectional view of an organic light emitting display according to one exemplary embodiment of the present invention.

FIG. 5 is a sectional view of an organic light emitting display according to one exemplary embodiment of the present invention.

Referring to FIG. 5, an organic light emitting display 400 according to one exemplary embodiment may include a substrate 401, an organic light emitting diode 500, and an encapsulation layer 490 covering the organic light emitting diode 500. The encapsulation layer 490 may have a multilayer structure of an inorganic material layer/organic material layer/inorganic material layer. A thin film transistor Td acting as a driving device and the organic light emitting diode 500 connected to the thin film transistor Td are disposed on the substrate 401.

Although not shown in the drawings, the organic light emitting display further includes a gate line and a data line intersecting each other to define a pixel region, a power line extending parallel to one of the gate line and the data line and separated therefrom, a switching thin film transistor connected to the gate line and the data line, and a storage capacitor connected to the power line and one electrode of the switching thin film transistor on the substrate 401.

The thin film transistor Td is connected to the switching thin film transistor and includes a semiconductor layer 410, a gate electrode 430, a source electrode 452 and a drain electrode 454.

The semiconductor layer 410 is formed on the substrate 401 and may be formed of an oxide semiconductor material or polycrystalline silicon. When the semiconductor layer 410 is formed of the oxide semiconductor material, a light shielding pattern (not shown) may be formed under the semiconductor layer 410 to prevent degradation of the semiconductor layer 401 due to light by blocking light from entering the semiconductor layer 410. Alternatively, the semiconductor layer 410 may be formed of polycrystalline silicon. In this alternative embodiment, both edges of the semiconductor layer 410 may be doped with impurities.

A gate insulation layer 420 comprising an insulating material may be formed over the substrate 401 to be disposed on the semiconductor layer 410. The gate insulation layer 420 may be formed of an inorganic insulating material, such as silicon oxide or silicon nitride.

The gate electrode 430 is formed of a conductive material such as a metal and is disposed at a location on the gate insulation layer 420 corresponding to the center of the semiconductor layer 410. The gate electrode 430 is connected to the switching thin film transistor.

An interlayer insulation layer 440 is formed of an insulating material over the substrate 401 to be disposed on the gate electrode 430. The interlayer insulation layer 440 may be formed of an inorganic insulation material, such as silicon oxide or silicon nitride, or an organic insulation material, such as benzocyclobutene or photo-acryl.

The interlayer insulation layer 440 has first and second semiconductor layer contact holes 442 and 444, respectively, which expose opposite sides of the semiconductor layer 410, respectively. The first and second semiconductor layer contact holes 442 and 444 are disposed at opposite sides of the gate electrode 430 to be separated therefrom.

A source electrode 452 and a drain electrode 454 formed of a conductive material are disposed on the interlayer insulation layer 440. The source electrode 452 and the drain electrode 454 are separated from each other around the gate electrode 430 and contact the opposite sides of the semiconductor layer 410 through the first and second semiconductor layer contact holes 442 and 444, respectively. The source electrode 452 is connected to the power line (not shown).

The semiconductor layer 410, the gate electrode 430, the source electrode 452, and the drain electrode 454 constitute the thin film transistor Td. In this embodiment, the thin film transistor Td has a coplanar structure wherein the gate electrode 430, the source electrode 452 and the drain electrode 454 are disposed on the semiconductor layer 410.

Alternatively, the thin film transistor Td may have an inverted staggered structure wherein the gate electrode is disposed at a lower side of a semiconductor layer and the source electrode and the drain electrode are disposed at an upper side of the semiconductor layer. In this structure, the semiconductor layer may be formed of non-crystalline silicon. On the other hand, the switching thin film transistor (not shown) may have substantially the same structure as the thin film transistor Td.

The organic light emitting display 400 may include a color filter 460 that absorbs light emitted from the organic light emitting diode 500. For example, the color filter 360 can absorb red (R), green (G), blue (B) and white (W) light. In this case, each of color filter patterns adapted to absorb red, green and blue light may be separately formed in the corresponding pixel region to overlap an organic light emitting layer 530 of the organic light emitting diode 500, which emits light in a wavelength band to be absorbed by the corresponding color filter pattern. With the color filter 460, the organic light emitting display 400 can realize full-color display.

For example, when the organic light emitting display 400 is a bottom emission type, the color filter 460 for absorbing light may be disposed on the interlayer insulation layer 440 that corresponds to the organic light emitting diode 500. In an alternative embodiment, in which the organic light emitting display 400 is a top emission type, the color filter may be disposed on the organic light emitting diode 500, that is, on the second electrode 520. By way of example, the color filter 460 may have a thickness of 2 μm to 5 μm. In this embodiment, the organic light emitting diode 500 may be a white light emitting diode having a tandem structure, as shown in FIG. 4.

A protective layer 470 is formed to cover the thin film transistor Td. The protective layer 470 has a drain contact hole 472 that exposes the drain electrode 454.

A first electrode 510 is formed on the protective layer 470 to be separately disposed in each pixel region and is connected to the drain electrode 454 of the thin film transistor Td through the drain contact hole 472.

The first electrode 510 may be an anode and may be formed of a conductive material having a relatively high work function. For example, the first electrode 510 may be formed of a transparent conductive material, such as ITO, IZO or ZnO.

On the other hand, when the organic light emitting display 400 is a top emission type, a reflective electrode or a reflective layer may be further formed on a lower surface of the first electrode 510. For example, the reflective electrode or the reflective layer may be formed of one material selected from among aluminum (Al), silver (Ag), nickel (Ni), and aluminum-palladium-copper (APC) alloys.

A bank layer 486 may be formed on the protective layer 470 to cover an edge of the first electrode 510. The bank layer 480 exposes a central region of the first electrode 510 corresponding to the pixel region.

A light emitting stack 530 is formed on the first electrode 510. By way of example, the light emitting stack 530 may include at least two light emitting stacks as shown in FIG. 4 to form a tandem structure of the organic light emitting diode 500.

A second electrode 520 is formed on the light emitting stack 530 to be disposed above the substrate 401. The second electrode 520 is disposed over a display region and may be formed of a conductive material having a relatively low work function to be used as a cathode. For example, the second electrode 520 may be formed of one of aluminum (Al), magnesium (Mg), and an AlMg alloy.

The first electrode 510, the light emitting stack 530 and the second electrode 520 constitute the organic light emitting diode 500.

An encapsulation layer 490 is formed on the second electrode 520 to prevent external moisture from entering the organic light emitting diode 500. Although not shown in the drawings, the encapsulation layer 490 may have a trilayer structure in which a first inorganic layer, an organic layer and a second inorganic layer are sequentially stacked, without being limited thereto.

Next, the present invention will be described in more detail with reference to examples. However, it should be noted that these examples are provided for illustration only and should not be construed in any way as limiting the invention.

EXAMPLES

Example 1

In a vacuum chamber at a pressure of $5 \times 10^{-8}$ to $7 \times 10^{-8}$ torr, an organic light emitting diode was fabricated by sequentially depositing a hole injection layer, a hole transport layer (HTL1), a blue light emitting layer (a blue host material (BH) and a blue fluorescent dopant material (BD, with 4 wt % doping)), an electron transport layer (ETL1), an electron injection layer (LiF) and a cathode on an ITO substrate (anode).

Figure 6:
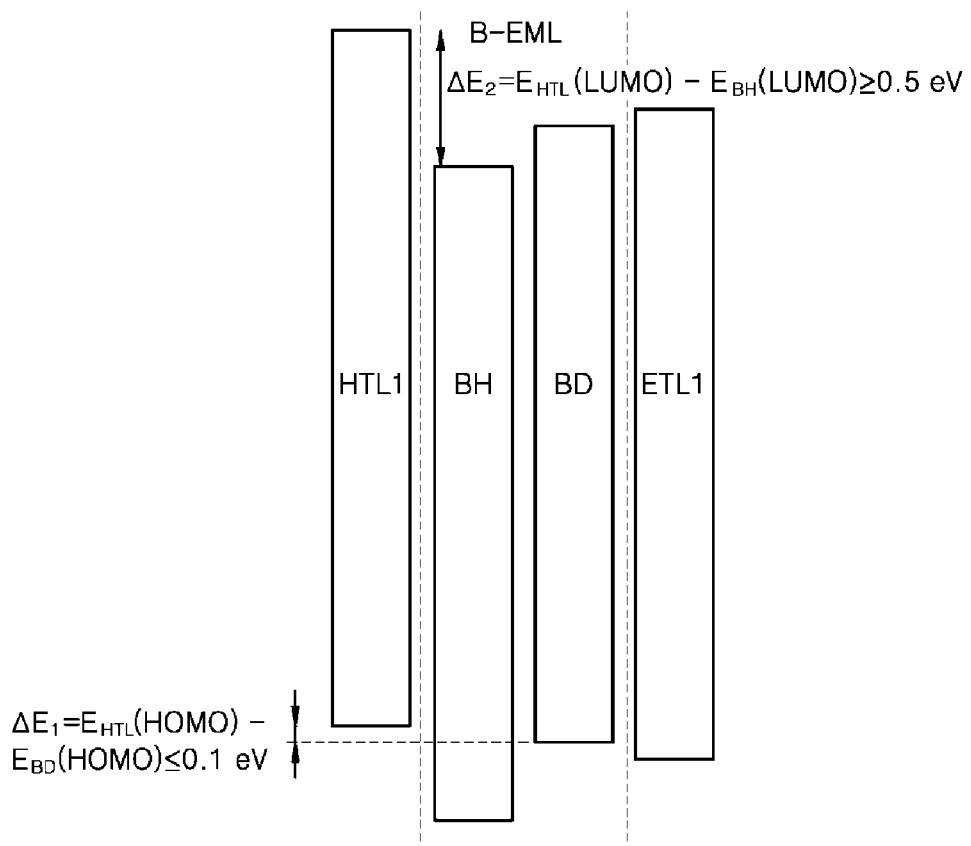
FIG. 6 is an energy diagram depicting energy levels of an organic light emitting diode of Example 1.

FIG. 6 is an energy diagram depicting the energy levels of HTL1/BH+BD/ETL1 of the fabricated organic light emitting diode. In evaluation of the energy level, it could be seen that, in the fabricated organic light emitting diode, the difference between the HOMO energy level of HTL1 and the HOMO energy level of BD was 0.1 eV or less and the difference between the LUMO energy level of HTL1 and the LUMO energy level of BH was 0.5 eV or more. Referring to FIG. 6, the difference between the HOMO energy level of HTL1 and the HOMO energy level of BD was 0.1 eV or less and the difference between the LUMO energy level of HTL1 and the LUMO energy level of BH was 0.5 eV or more, as indicated by dotted lines.

Comparative Example 1

In a vacuum chamber at a pressure of $5 \times 10^{-8}$ to $7 \times 10^{-8}$ torr, an organic light emitting diode was fabricated by sequentially depositing a hole injection layer, a hole transport layer (HTL2), a blue light emitting layer (a blue host material (BH) and a blue fluorescent dopant material (BD, with 4 wt % doping)), an electron transport layer (ETL1), an electron injection layer (LiF) and a cathode on an ITO substrate (anode).

Figure 7:
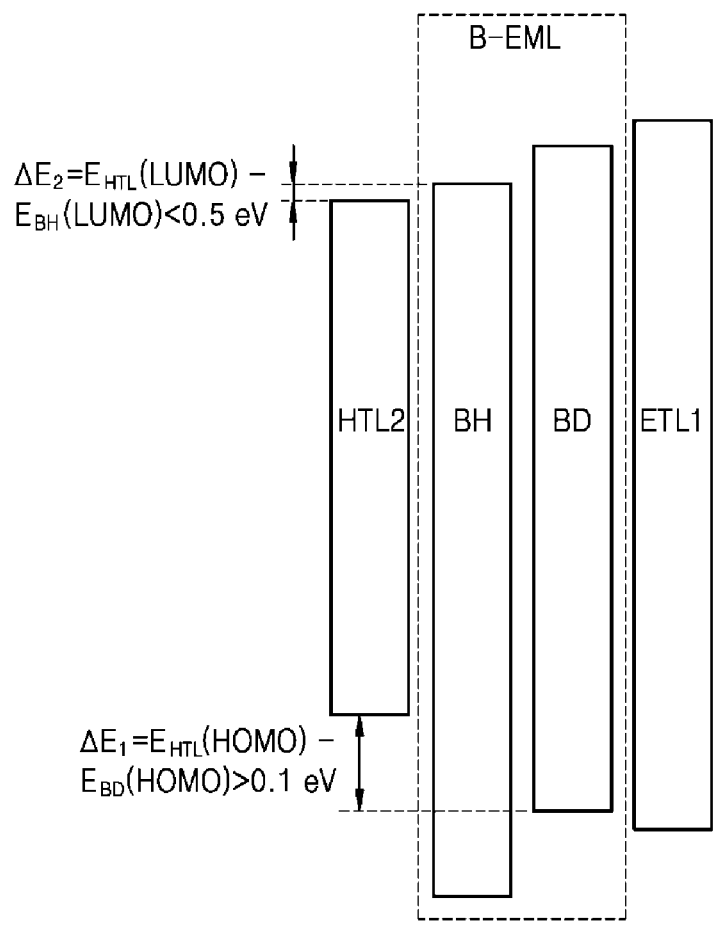
FIG. 7 is an energy diagram depicting energy levels of an organic light emitting diode of Comparative Example 1.

FIG. 7 is an energy diagram depicting the energy levels of HTL2/BH+BD/ETL1 of the fabricated organic light emitting diode of Comparative Example 1. In evaulating the energy levels, it could be seen that, in the fabricated organic light emitting diode, the difference between the HOMO energy level of HTL2 and the HOMO energy level of BD was greater than 0.1 eV and the difference between the LUMO energy level of HTL1 and the LUMO energy level of BH was less than 0.5 eV. Referring to FIG. 7, the difference between the HOMO energy level of HTL2 and the HOMO energy level of BD was greater than 0.1 eV and the difference between the LUMO energy level of HTL1 and the LUMO energy level of BH was less than 0.5 eV, as indicated by dotted lines.

The materials used in Example 1 and Comparative Example 1 and energy levels thereof are shown as follows.

| Name | Structure | HOMO (eV) | LUMO (eV) | $T_1$ (eV) |
|---|---|---|---|---|
| HTL1 | | −5.79 | −2.57 | 2.82 |

-continued
| Name | Structure | HOMO (eV) | LUMO (eV) | T₁ (eV) |
|---|---|---|---|---|
| HTL2 | 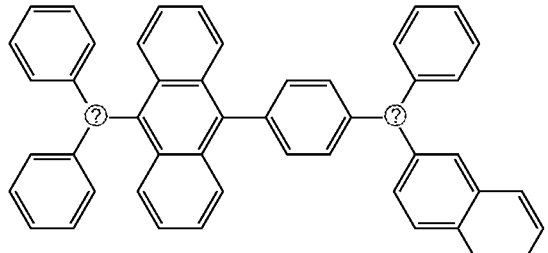 | −5.4 | −3.2 | |
| ETL1 | 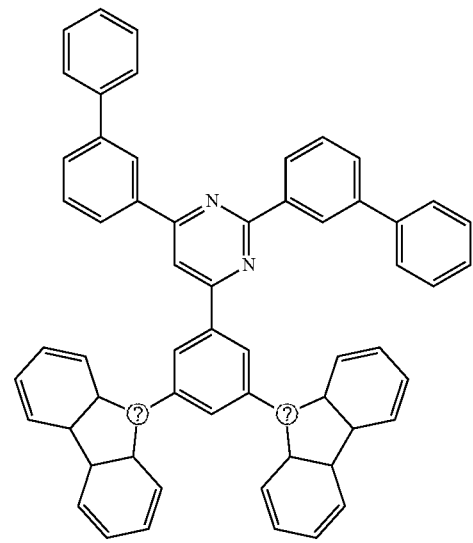 [SMILES: C1=CC2C3C=CC=CC3C(c3cc(-c4cc(-c5cccc(-c6ccccc6)c5)nc(-c5cccc(-c6ccccc6)c5)n4)cc(C4C5C=CC=CC5C5C=CC=CC54)c3)C2C=C1] | −6.21 | −2.73 | 2.67 |
| BH | 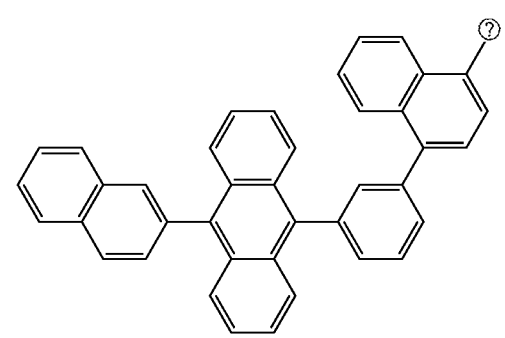 [SMILES: Cc1ccc(-c2cccc(-c3c4ccccc4c(-c4ccc5ccccc5c4)c4ccccc34)c2)c2ccccc12] | −6.00 | −2.99 | 1.85 |

-continued

| Name | Structure | HOMO (eV) | LUMO (eV) | $T_1$ (eV) |
|---|---|---|---|---|
| BD | | −5.61 | −2.81 | — |

Experimental Example 1

Evaluation of Characteristics of Organic Light Emitting Diode

The operation characteristics of the organic light emitting diodes fabricated in Example 1 and Comparative Example 1 were evaluated.

Table 1 shows the voltage-current density, brightness-current efficiency, brightness-external quantum efficiency (EQE), and lifespan of the organic light emitting diodes fabricated in Example 1 and Comparative Example 1.

TABLE 1

| Item | Voltage (V) | Voltage-current density (Cd/A) | Brightness-external quantum efficiency (EQE) | Lifespan (hr) |
|---|---|---|---|---|
| Example 1 | 3.7 | 8.0 | 8.1 | 50 |
| Comparative Example 1 | 4.3 | 6.5 | 6.8 | 25 |

The hole transport layer (HTL2) used in Comparative Example 1 has a deeper energy level than the hole transport layer HTL1 used in Example 1 and thus does not satisfy the following conditions (F) and (G):

(F) The hole transport layer material has a higher LUMO energy level than the blue host material and a difference in LUMO energy level between the hole transport layer material and the blue host material is 0.5 eV or more (i.e., the difference between the LUMO energy levels is less than 0.5 eV in Comparative Example 1); and (G) the hole transport layer material has a higher LUMO energy level than the blue fluorescent dopant material (i.e., the difference between the LUMO energy levels is greater than 1.0 eV in Comparative Example 1).

In Comparative Example 1, the difference in HOMO energy levels between the hole transport layer (HTL2) and the blue host material (BH) is small, thereby making it difficult for the hole transport layer (HTL2) to have an electron blocking function. As a result, electrons can be migrated not only into the blue light emitting layer (EML=BH+BD) but also into the hole transport layer (HTL2), thereby causing an undesired addition reaction. As a result of such an addition reaction, the number of impurities increases in the hole transport layer (HTL2) which act as hole traps, thereby decreasing operation characteristics or lifespan of the organic light emitting diode.

Although the present invention has been described with reference to some embodiments in conjunction with the accompanying drawings, it should be understood that the foregoing embodiments are provided for illustration only and are not to be in any way construed as limiting the present invention, and that various modifications, changes, alterations, and equivalent embodiments can be made by those skilled in the art without departing from the spirit and scope of the invention.

LIST OF REFERENCE NUMERALS

100, 200, 300, 500: organic light emitting diode
110, 210, 310, 410, 510: first electrode
120, 220, 320, 420, 520: second electrode
140, 240, 530: light emitting stack
141, 241, 341, 351: hole transport layer
142, 242, 342, 352: blue light emitting layer
243: hole injection layer
244: electron transport layer
245: electron injection layer
340: first light emitting stack
350: second light emitting stack
360: charge generation layer
362: N-type charge generation layer
364: P-type charge generation layer
400: organic light emitting display

What is claimed is:
1. An organic light emitting diode comprising:
a first electrode;
a light emitting stack disposed on the first electrode; and
a second electrode disposed on the light emitting stack,
wherein the light emitting stack comprises a hole transport layer and a blue light emitting layer such that the hole transport layer and the blue light emitting layer are sequentially stacked on the first electrode, the blue light emitting layer comprising a blue host material and a blue fluorescent dopant material, and the hole transport layer comprising a hole transport layer material, and wherein:

the blue fluorescent dopant material has a higher LUMO (Lowest Unoccupied Molecular Orbital) energy level than the blue host material;

the blue fluorescent dopant material has a higher HOMO (Highest Occupied Molecular Orbital) energy level than the blue host material;

the blue fluorescent dopant material has a lower singlet energy than the blue host material;

the hole transport layer material has a higher HOMO energy level than the blue host material;

the hole transport layer material has a higher HOMO energy level than the blue fluorescent dopant material and a difference in the HOMO energy levels between the hole transport layer material and the blue fluorescent dopant material is 0.1 eV or less;

the hole transport layer material has a higher LUMO energy level than the blue host material and a difference in LUMO energy levels between the hole transport layer material and the blue host material is 0.5 eV or more; and the hole transport layer material has a higher LUMO energy level than the blue fluorescent dopant material.

2. The organic light emitting diode according to claim 1, wherein the hole transport layer material comprises a tertiary amine-containing compound.

3. The organic light emitting diode according to claim 1, wherein the blue host material comprises an anthracene-containing compound.

4. The organic light emitting diode according to claim 1, wherein the blue fluorescent dopant material comprises a pyrene amine-containing compound.

5. The organic light emitting diode according to claim 1, wherein the blue light emitting layer comprises 1 wt % to 5 wt % of the blue fluorescent dopant material.

6. The organic light emitting diode according to claim 1, wherein the light emitting stack consists of a first light emitting stack and at least one additional light emitting stack comprising a second light emitting stack is further included between the first electrode and the second electrode.

7. The organic light emitting diode according to claim 6, further comprising:

a charge generation layer interposed between the first light emitting stack and the second light emitting stack.

8. The organic light emitting diode according to claim 7, wherein the charge generation layer comprises an N-type charge generation layer and a P-type charge generation layer.

9. The organic light emitting diode according to claim 6, wherein the organic light emitting diode is a white organic light emitting diode and the additional light emitting stack emits red (R), green (G) or yellow (Y) light.

10. An organic light emitting display comprising:
a substrate;
the organic light emitting diode according to claim 1 disposed on the substrate; and
a driving device interposed between the substrate and the organic light emitting diode and connected to the first electrode.

11. The organic light emitting display according to claim 10, further comprising:

a color filter interposed between the substrate and the first electrode or disposed on the organic light emitting diode.

12. The organic light emitting display according to claim 10, wherein the hole transport layer material of the organic light emitting diode comprises a tertiary amine-containing compound.

13. The organic light emitting display according to claim 10, wherein the blue host material of the organic light emitting diode comprises an anthracene-containing compound.

14. The organic light emitting display according to claim 10, wherein the blue fluorescent dopant material of the organic light emitting diode comprises a pyrene amine-containing compound.

15. The organic light emitting display according to claim 10, wherein the blue light emitting layer of the organic light emitting diode comprises 1 wt % to 5 wt % of the blue fluorescent dopant material.

* * * * *